US009720329B2

(12) United States Patent
Enkisch et al.

(10) Patent No.: US 9,720,329 B2
(45) Date of Patent: Aug. 1, 2017

(54) PROJECTION OBJECTIVE OF A MICROLITHOGRAPHIC PROJECTION EXPOSURE APPARATUS

(71) Applicant: Carl Zeiss SMT GmbH, Oberkochen (DE)

(72) Inventors: Hartmut Enkisch, Aalen (DE); Stephan Muellender, Aalen (DE); Hans-Juergen Mann, Oberkochen (DE); Rolf Freimann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/070,757

(22) Filed: Mar. 15, 2016

(65) Prior Publication Data
US 2016/0195817 A1    Jul. 7, 2016

Related U.S. Application Data

(60) Division of application No. 13/858,199, filed on Apr. 8, 2013, now abandoned, which is a continuation of
(Continued)

(30) Foreign Application Priority Data

Nov. 5, 2010  (DE) .................. 10 2010 043 498

(51) Int. Cl.
*G03F 7/20* (2006.01)
*G02B 7/198* (2006.01)

(52) U.S. Cl.
CPC ............. *G03F 7/702* (2013.01); *G02B 7/198* (2013.01); *G03F 7/70233* (2013.01); *G03F 7/70308* (2013.01)

(58) Field of Classification Search
CPC ..... G02B 7/198; G03F 7/702; G03F 7/70308; G03F 7/70233; G03F 7/70225
See application file for complete search history.

(56) References Cited

U.S. PATENT DOCUMENTS 5,136,413 A    8/1992   MacDonald et al.
5,863,712 A    1/1999   Von-Bunau et al.
(Continued)

FOREIGN PATENT DOCUMENTS

CN    1350185 A     5/2002
CN    101836151 A   9/2010
(Continued)

OTHER PUBLICATIONS

Japanese Office Action for JP Patent Application No. 2013-537130 dated Sep. 8, 2015 with English translation.
(Continued)

*Primary Examiner* — Steven H Whitesell Gordon
(74) *Attorney, Agent, or Firm* — Fish & Richardson P.C.

(57) ABSTRACT

The invention concerns a projection objective of a microlithographic projection exposure apparatus designed for EUV, for imaging an object plane illuminated in operation of the projection exposure apparatus into an image plane. The projection objective has at least one mirror segment arrangement comprising a plurality of separate mirror segments. Associated with the mirror segments of the same mirror segment arrangement are partial beam paths which are different from each other and which respectively provide for imaging of the object plane (OP) into the image plane (IP). The partial beam paths are superposed in the image plane (IP). At least two partial beams which are superposed in the same point in the image plane (IP) were reflected by different mirror segments of the same mirror segment arrangement.

19 Claims, 11 Drawing Sheets

Related U.S. Application Data application No. PCT/EP2011/069308, filed on Nov. 3, 2011.

(60) Provisional application No. 61/410,521, filed on Nov. 5, 2010.

(56) References Cited

U.S. PATENT DOCUMENTS

| | | |
|---|---|---|
| 7,019,824 B2 | 3/2006 | Wegmann et al. |
| 7,333,216 B2 | 2/2008 | Wegmann et al. |
| 7,538,856 B2 | 5/2009 | Kajiyama et al. |
| 7,583,433 B2 | 9/2009 | Antoni et al. |
| 8,228,485 B2 | 7/2012 | Freimann et al. |
| 8,558,991 B2 | 10/2013 | Mann |
| 2002/0171922 A1 | 11/2002 | Shiraishi et al. |
| 2003/0214735 A1 | 11/2003 | Masaki et al. |
| 2004/0013956 A1 | 1/2004 | Sogard |
| 2005/0093041 A1 | 5/2005 | Singer et al. |
| 2005/0146701 A1 | 7/2005 | Holderer et al. |
| 2006/0284113 A1 | 12/2006 | Chang et al. |
| 2008/0088811 A1 | 4/2008 | Geyl |
| 2008/0143984 A1 | 6/2008 | Holderer et al. |
| 2008/0144043 A1 | 6/2008 | Wegmann et al. |
| 2008/0165415 A1 | 7/2008 | Chan et al. |
| 2009/0027641 A1 | 1/2009 | Kajiyama et al. |
| 2010/0231884 A1 | 9/2010 | Mann |
| 2013/0242278 A1 | 9/2013 | Enkisch et al. |

FOREIGN PATENT DOCUMENTS

| | | |
|---|---|---|
| DE | 3934546 A1 | 4/1991 |
| DE | 10 2007 051 669 | 4/2009 |
| DE | 102008041801 | 3/2010 |
| JP | 2003-329820 | 11/2003 |
| JP | 2005-524237 | 8/2005 |
| JP | 2006-352140 | 12/2006 |
| JP | 2008-518454 | 5/2008 |
| JP | 2009-032938 | 2/2009 |
| JP | 2011-501446 | 1/2011 |
| JP | 2011-108974 | 6/2011 |
| WO | WO 03/093903 A2 | 11/2003 |
| WO | WO 2007/062808 A1 | 6/2007 |
| WO | WO 2008/020965 A2 | 2/2008 |
| WO | WO 2009/052932 A1 | 4/2009 |

OTHER PUBLICATIONS

Taiwanese Office Action and Search Report, with translation thereof, for TW Application No. 100140286, dated May 13, 2015.
International Search Report and Written Opinion issued in PCT/EP2011/069308 on Jan. 3, 2012.
English translation and Office Action for DE 10 2010 043 498.1, dated Feb. 18, 2011.
International Preliminary Report on Patentability issued in PCT/EP2011/069308 on May 8, 2013.
European Office Action for EP Appln No. 11 788 392.6-1553, dated Jun. 13, 2014.
Chinese Office Action and Search Report, with English translation thereof, for CN Appl No. 201180053146.7, dated Jan. 23, 2015.
Hardy, John W., Active Optics: A New Technology for the Control of Light, IEEE, vol. 66, No. 6, Jun. 1978.

PROJECTION OBJECTIVE OF A MICROLITHOGRAPHIC PROJECTION EXPOSURE APPARATUS

CROSS REFERENCE TO RELATED APPLICATIONS

This application is a divisional of, and claims priority under 35 USC to, U.S. application Ser. No. 13/858,199, filed Apr. 8, 2013, which is a continuation of, and claims priority under 35 USC to, international patent application PCT/EP2011/069308, filed Nov. 3, 2011, which claims priority under 35 USC 119 of German Patent Application DE 10 2010 043 498.1 and which also claims priority under 35 USC 119(e) of U.S. 61/410,521, both filed on Nov. 5, 2010. The content of these applications is hereby incorporated by reference.

BACKGROUND OF THE INVENTION

Field of the Invention

The invention concerns a projection objective of a microlithographic projection exposure apparatus designed for EUV and a method of optically adjusting a projection objective.

Background

Microlithography is used for the production of microstructured components such as for example integrated circuits or LCDs. The microlithography process is carried out in a so-called projection exposure apparatus having an illumination system and a projection objective. In that case the image of a mask (=reticle) illuminated via the illumination system is projected via the projection objective onto a substrate (for example a silicon wafer) which is coated with a light-sensitive layer (photoresist) and arranged in the image plane of the projection objective to transfer the mask structure onto the light-sensitive coating on the substrate.

Mirrors are used as optical components for the imaging process in projection objectives designed for the EUV range, that is to say at wavelengths of for example about 13 nm or about 7 nm, due to the lack of availability of suitable translucent refractive materials.

Typical projection objectives designed for EUV as are known for example from U.S. Pat. No. 7,538,856 B2 can for example have an image-side numerical aperture (NA) in the range from 0.2 to 0.3 and reproduce an object field (for example which is annular) in the image plane or wafer plane.

In the case of approaches for increasing the image-side numerical aperture (NA), a problem which arises in practice is that limits are set in many respects on an increase in the size of the mirror surfaces, that is linked to that increase in the numerical aperture; on the one hand, with increasing dimensions of the mirrors, it becomes increasingly difficult to reduce in particular long-wave surface errors to values below the required limit values, in which respect the larger mirror surfaces require inter alia greater aspheres. In addition increasing dimensions for the mirrors require larger processing machines for manufacture, and stricter requirements are placed on the machining tools used (such as for example grinding, lapping and polishing machines, interferometers and cleaning and coating installations). In addition, the manufacture of larger mirrors makes it necessary to use heavier mirror base bodies which, as from a certain limit, can scarcely still be mounted in position or flex beyond an acceptable degree due to the force of gravity.

A further problem involved with the increase in mirror dimensions results from shadowing of regions of the illumination beam path. In that respect it is admittedly possible to use systems with central obscuration but therein the above-described problems still arise. It is known inter alia from WO 2008/020965 A2 to produce a collector mirror of the EUV light source by a plurality of discrete substrate being directed towards a common focal point and then each coated with a multiple layer which is reflective for EUV. To orient the collector mirror which for example is in the form of an ellipsoidal mirror one or more actuators are used for orientation of at least one of the substrate relative to a carrier structure, such orientation process being effected in dependence on a measurement of the light which is deflected from a first focal point to a second focal point of the ellipsoidal mirror.

SUMMARY OF THE INVENTION

An object of the present invention is to provide a projection objective of a microlithographic projection exposure apparatus which permits implementation of higher numerical apertures while at least substantially avoiding the above-described production-engineering problems.

That object is attained by a projection objective as described in the following paragraph.

A projection objective according to the invention of a microlithographic projection exposure apparatus designed for EUV, for imaging an object plane illuminated in operation of the projection exposure apparatus into an image plane, has at least one mirror segment arrangement comprising a plurality of separate mirror segments, wherein associated with the mirror segments of the same mirror segment arrangement are partial beam paths which are different from each other and which respectively provide for imaging of the object plane into the image plane, wherein the partial beam paths are superposed in the image plane and wherein at least two partial beams which are superposed in the same point in the image plane were reflected by different mirror segments of the same mirror segment arrangement.

In that respect adjacent mirror segments in the mirror segment arrangement according to the invention can be optically seamlessly assembled together or can also be at a finite spacing relative to each other, which can be governed either by the production process or which can also be specifically targetedly provided for the purposes of adjustment of the mirror segment arrangement.

The partial beam paths which according to the invention are superposed in the image plane and which respectively involve imaging of the object plane (or the mask) into the image plane or wafer plane and the images of which are superposed in the image plane are also referred to here and hereinafter as "simultaneous partial beam paths".

The invention is based in particular on the concept of embodying at least one mirror in the imaging beam path of a projection objective in segment-wise manner, that is to say replacing a monolithic mirror by a mirror segment arrangement comprising a plurality of separate mirror segments.

Furthermore, at least two partial beams which are superposed in the same point in the image plane were reflected by different mirror segments of the same mirror segment arrangement. Accordingly, according to the invention, one and the same point in the image plane is reached by beams which have been reflected by different mirror segments of the mirror segment arrangement and which superpose in the point in the image plane. With other words, one object field is projected into one image field with contribution or collaboration of different mirror segments of the same mirror segment arrangement. The invention therefore e.g. differs from prior art concepts of optical systems having different optical groups in such a sense that different object fields (which are spatially separated from each other) are attributed via separate optical paths (including different mirrors as beam guiding components) to different image fields, with one and the same point in the object field being exclusively irradiated by beams which have been reflected by one single mirror. In contrast to such concepts, the present invention makes it possible to realize significant higher numerical apertures.

That segment-wise structure of at least one mirror, that is to say the replacement thereof by a mirror segment arrangement with separate mirror segments, has substantial advantages in terms of production engineering insofar as on the one hand the maximum diameter to be processed in respect of the mirror segment arrangement according to the invention can be substantially less (only for example of the order of magnitude of 70% or less) than the maximum diameter of a corresponding unsegmented mirror. Under some circumstances consequently manufacture is only now made technologically possible at all, or it is possible to avoid additional capital investment in new and larger production machines. On the other hand, as the individual mirror segments can be thinner, the components to be handled are of a substantially lower (overall) mass, just by way of example of the order of magnitude of 25% or less, in comparison with a corresponding unsegmented mirror. As a consequence of the reduction in the total mass, gravity-induced deformation of the mirror segments or arrangement due to the inherent weight thereof can also be reduced.

The disclosure also relates to a projection objective according to the invention of a microlithographic projection exposure apparatus designed for EUV, for imaging an object plane illuminated in operation of the projection exposure apparatus into an image plane has at least one mirror segment arrangement comprising a plurality of separate mirror segments, wherein associated with the mirror segments of the same mirror segment arrangement are partial beam paths which are different from each other and which respectively provide for imaging of the object plane into the image plane, wherein the partial beam paths are superposed in the image plane.

In an embodiment the at least one mirror segment arrangement is the reflecting arrangement of the projection objective, which arrangement is last in relation to the beam path at the image plane side.

In an embodiment the at least one mirror segment arrangement is the reflecting arrangement of the projection objective having the maximum size of the total optically effective surface (i.e. the total reflecting surface).

In an embodiment the at least one mirror segment arrangement has at least three mirror segments, in particular at least four mirror segments.

In an embodiment the mirror segments of the same mirror segment arrangement respectively form with each other a continuous reflecting surface interrupted only by transitional regions which are optionally present between adjacent mirror segments.

In an embodiment there are provided at least two mirror segment arrangements which each have at least two separate mirror segments, wherein associated with the mirror segments of the same mirror segment arrangement are beam paths which are different from each other and which respectively provide for imaging of the object plane into the image plane and which are superposed in the image plane.

In an embodiment a respective one of the mirror segments of the one mirror segment arrangement is associated with one of the mirror segments of the other mirror segment arrangement in pair-wise relationship with the same partial beam path.

In an embodiment there is further provided a shutter arrangement so designed that illumination of the at least one mirror segment arrangement can be selectively limited to different mirror segments of the mirror segment arrangement.

The invention also relates to a projection objective of a microlithographic projection exposure apparatus designed for EUV, for imaging an object plane illuminated in operation of the projection exposure apparatus into an image plane, wherein the projection objective comprises a plurality of mirrors, and wherein the mirror of the plurality of mirrors having the maximum size is formed as a mirror segment arrangement comprising a plurality of separate mirror segments.

As further discussed below, the segmented configuration of the largest mirror (which can be in particular the last mirror at the image plane side) is particularly advantageous since the mirror is particularly relevant for the numerical aperture (NA) at the image side.

In a further aspect of the invention account is taken of the fact that intermediate spaces occur between the individual mirror segments and influence the imaging properties. That problem can occur in particular in connection with the last mirror in the beam path, if more specifically that mirror is not exactly in a pupil plane by virtue of a beam path which is telecentric at the image plane side, and consequently the induced imaging errors have a field-dependent component.

The invention now involves the concept that arranging a suitable obscuration shutter arrangement in the pupil plane of the system makes it possible to provide an obscuration effect which is precisely or at least partially such that the aforementioned mirror segment intermediate spaces lie in the shadow of the obscuration shutter or the shadow of that obscuration out of the pupil plane precisely or at least partially covers the mirror segment intermediate spaces. In other words according to the invention use is made of the fact that the mirror segment intermediate spaces remain without having a disturbing influence on the imaging properties insofar as just the shadow of the obscuration shutter arrangement is produced on the corresponding region. With other words, the shadow projection of the obscuration shutter on the mirror segment arrangement at least partially covers over the mirror segment intermediate spaces. Accordingly, light which—without the obscuration shutter—would be incident on mirror segment intermediate spaces is blinded out/stopped down by the obscuration shutter.

With the foregoing background in mind in accordance with an embodiment there is provided an obscuration shutter in a pupil plane of the projection objective, wherein the obscuration shutter is so designed that the shadow projection of the obscuration shutter on the mirror segment arrangement covers over the mirror segment intermediate spaces.

In an advantageous embodiment in addition the at least one mirror segment arrangement is designed in such a way (or with such a "partition" between the individual mirror segments) that mirror segment intermediate spaces between the mirror segments are of a geometry which is at least region-wise of an annular shape or in the shape of a ring segment. Such an annular geometry for the mirror segment intermediate spaces has the additional advantage that no orientation-dependent imaging effects occur, due to obscuration. In contrast (in relation to the light propagation direction or the optical system axis) mirror segment intermediate spaces which are arranged at different azimuth angles and which extend in the radial direction have the effect that certain diffraction orders pass into the region of the mirror segment intermediate spaces and other diffraction orders do not go onto the mirror segment intermediate spaces so that structures involving a mutually different orientation exhibit a different imaging characteristic. The above-described concept however is not limited to mirror segment intermediate spaces which are in ring form or in the shape of a ring segment, so that other geometries are also embraced, in which the mirror segment intermediate spaces lie in the shadow of the obscuration shutter.

As the obscuration shutter arrangement is to have an influence on the imaging properties, that is as slight as possible or causes little disturbance, it preferably involves a rotational symmetry (without however the invention being restricted thereto). The influence of the obscuration shutter arrangement on the imaging properties is at its slightest when the obscuration shutter arrangement is of an annular geometry as then each structure to be imaged or each diffraction order experiences the same obscuration effect, independently of its orientation. In further embodiments the obscuration shutter arrangement can also be designed with an n-fold symmetry (in particular a four-fold symmetry) with respect to the optical system axis so that the same obscuration is achieved for certain structures or diffraction orders.

In a further aspect the invention also concerns a method of producing a projection objective of a microlithographic projection exposure apparatus designed for EUV, for imaging an object plane illuminated in operation of the projection exposure apparatus into an image plane, the projection objective having a plurality of mirrors, wherein at least one of the mirrors is composed of a plurality of separate mirror segments.

According to an embodiment, the composing of the mirror of a plurality of separate mirror segments is made such that at least two partial beams which are superposed in the same point in the image plane were reflected by different mirror segments of the plurality of separate mirror segments.

According to an embodiment, the mirror composed of a plurality of separate mirror segments is the last in relation to the beam path at the image plane side.

According to an embodiment, the mirror composed of a plurality of separate mirror segments is the mirror having the maximum size of the total optically effective surface.

According to an embodiment, at least two of those mirror segments can be optically seamlessly joined together (for example by wringing). In addition at least two of those mirror segments can also be fixed at a finite spacing relative to each other.

In a further aspect the invention also concerns a method of optically adjusting a projection objective of a microlithographic projection exposure apparatus, wherein the projection objective has a plurality of mirrors which are oriented during the adjustment operation into their working position for the lithography process, wherein the projection objective has at least one mirror segment arrangement comprising a plurality of separate mirror segments and wherein adjustment is effected in at least two adjustment steps which differ from each other in respect of the mirror segments contributing to imaging of the object plane into the image plane in the respective adjustment step.

The disclosure provides a method of optically adjusting a projection objective of a microlithographic projection exposure apparatus. The projection objective includes a plurality of mirrors. The projection objective includes a mirror segment arrangement comprising a plurality of separate mirror segments separated from each by transitional regions between adjacent mirror segments. The method includes orienting the mirror segments in an orientation in which a first subset of mirror segments image an object plane of the projection objective into an image plane of the projection objective. The method also includes orienting the mirror segments in an orientation in which a second subset of mirror segments image an object plane of the projection objective into an image plane of the projection objective. The first subset of mirror segments is not identical to the second subject of mirror segments.

The invention further concerns an arrangement for optically adjusting a projection objective of a microlithographic projection exposure apparatus, wherein the projection objective has a plurality of mirrors which are oriented during the adjustment operation into their working position for the lithography process, wherein the projection objective has at least one mirror segment arrangement comprising a plurality of separate mirror segments, wherein the arrangement has at least one variable shutter arrangement by which illumination of the mirror segment arrangement can be selectively limited to one or more of the mirror segments.

Further configurations of the invention are to be found in the description and the appendant claims.

The invention is described in greater detail hereinafter by embodiments by way of example illustrated in the accompanying drawings.

BRIEF DESCRIPTION OF THE DRAWINGS

In the drawings:

FIGS. 6, 7a-b, 8-10a-10b and 11a-11d show diagrammatic views to illustrate a further aspect of the present invention.

DETAILED DESCRIPTION OF PREFERRED EMBODIMENTS

Figure 1:
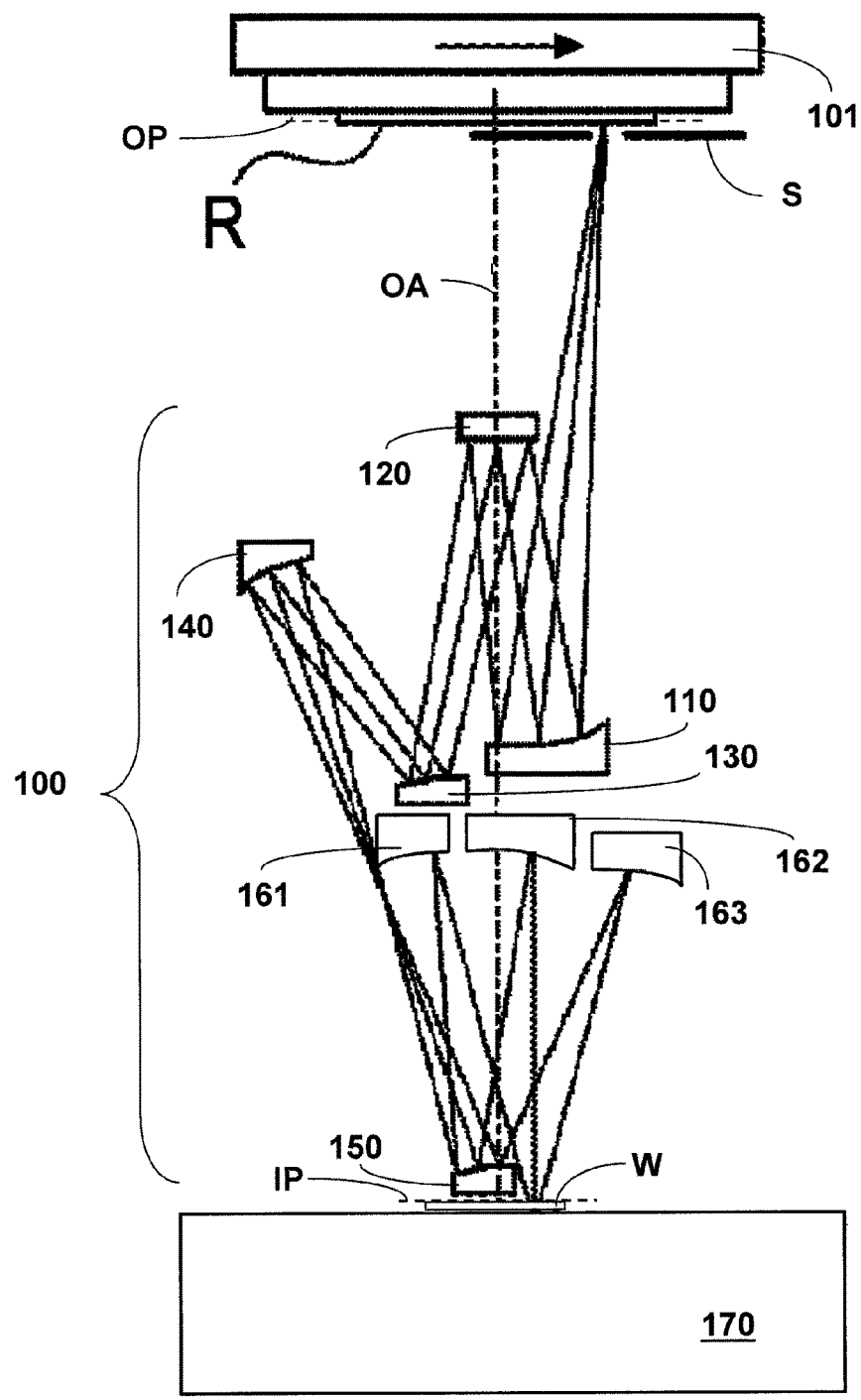
FIG. 1 shows a diagrammatic view to illustrate the structure of a projection objective according to an embodiment of the invention.

FIG. 1 shows a diagrammatic view of the structure of a projection objective 100 in which a mirror is replaced by a mirror segment arrangement comprising separate mirror segments. The basic structure of the projection objective (without the segmentation according to the invention) is known from U.S. Pat. No. 7,538,856 B2 and as such does not belong to the claimed subject-matter of the present application.

In the projection objective 100 EUV radiation is incident from an illumination system (not shown) on a mask (reticle) R having structures to be imaged through a slot S which defines the region of the mask R, that is to be illuminated. The projection objective 100 has a plurality of mirrors (in the illustrated embodiment, six mirrors) 110-160, wherein the mirror 160 which is last in relation to the beam path at the image plane side, as is only diagrammatically shown in FIG. 1, is in the form of mirror segment arrangement comprising separate mirror segments 161, 162 and 163.

The segmented configuration of the mirror which is last at the image plane side (and at the same time the largest) is particularly advantageous insofar as that mirror is particularly relevant for the numerical aperture (NA) at the image side. The invention however is not limited thereto so that, instead of the mirror which is last at the image plane side, another mirror of the projection objective 100 can also be subdivided into separate segments. In further embodiments a plurality of mirrors (that is to say two or more mirrors) can also be subdivided into separate segments, as is described hereinafter with reference to FIG. 2. It will be appreciated that in addition the number selected in FIG. 1 of three mirror segments is only by way of example and it is also possible to provide segmentation into more or fewer mirror segments (that is to say only two).

The projection objective 100 is telecentric at the image plane side but non-telecentric at the object plane side (that is to say on the part of the mask R) in order to avoid interference phenomena with the light incident from the illumination system.

A measuring arrangement 170 which is only diagrammatically indicated here serves, as is described in greater detail hereinafter, for measurement of the simultaneous partial beam paths or the superpositioning thereof.

Figure 2:
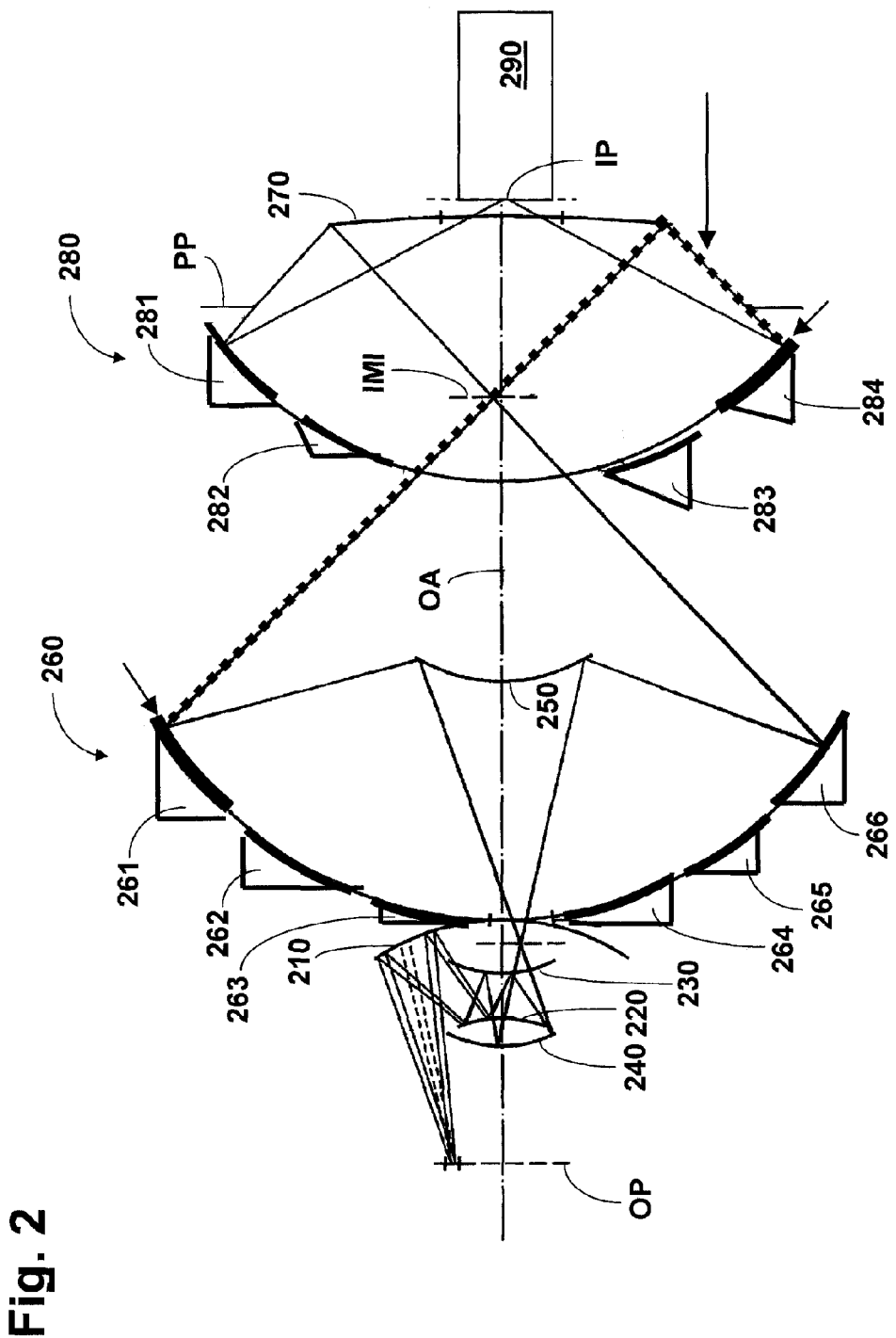
FIG. 2 shows a diagrammatic view to illustrate the structure of a projection objective according to a further embodiment of the invention.

FIG. 2 shows a diagrammatic view illustrating the structure of a projection objective 200 according to a further embodiment of the invention, in which there are two mirrors of segmented nature. The basic structure of the projection objective (without the segmentation according to the invention) is known from WO 2009/052932 A1 and as such does not belong to the claimed subject-matter of the present application.

The projection objective 200 has six unsegmented mirrors 210-250 and 270 and two mirror segment arrangements 260, 280 of which the mirror segment arrangement 280 which is last in relation to the beam path is subdivided into four mirror segments 281-284 while the mirror segment arrangement 260 which is in the third-from-last position in the direction of light propagation is subdivided into six mirror segments 261-266.

In addition the mirror segment arrangements 260 and 280 and mirrors 270 which are disposed in the last three positions in relation to the beam path on the image plane side are respectively obscured and have a through opening for light incident on the position of the optical axis OA. The mirror 250 which is disposed in the fourth-from-last position in relation to the beam path is not obscured and produces a shadowing defined by its outer peripheral edge in a pupil plane PP of the projection objective. There is an intermediate image IMI between the mirror segment arrangement 280 which is last in relation to the beam path, and the image plane IP.

In the projection objective 200 in FIG. 2, a respective one of the mirror segments 261-266 of the mirror segment arrangement 260, with one of the mirror segments 281-284 of the other mirror segment arrangement 280, is associated in pair-wise relationship with the same partial beam path. Both such a pair of mirror segments (namely that comprising the mirror segments 261 and 284) and also the corresponding portion a partial beam path are emphasized by arrows in FIG. 2. The totality of all of those pairs of segments defines a set of simultaneous partial beam paths. A measuring arrangement which is diagrammatically indicated in FIG. 2 and denoted by reference 290 and described hereinafter serves to ensure that on the one hand each partial beam path is stigmatic in itself and on the other hand the images respectively produced by the partial beam paths overlap in the wafer plane in accordance with the respective image structure width.

To adjust the projection objective the mirror segments of the mirror segment arrangement are oriented both relative to each other and also (as a whole) relative to the system by way of actuators. Accordingly the invention also concerns a combination with a measuring arrangement and an actuator system which permits adjustment of the mirror segments. The measuring arrangement according to the invention can be both already used during assembly or initial adjustment of the system and also during ongoing operation or in the scanner of the projection exposure apparatus.

A basically suitable arrangement is described in WO 2007/062808 A1 which discloses a "grazing incidence interferometer" for measurement of an active mirror. That interferometer can be used in a similar fashion for measurement of the mirror segment arrangement according to the invention. Furthermore, a system wave front interferometer as is disclosed in US 2008/0144043 A1 can also be used to check the orientation of the overall mirror. When using that interferometer, use is made of the fact that the aberrations of the projection objective are influenced by a variation in mirror position or orientation, wherein those changes in aberration in turn can be detected via the system wave front interferometer.

Simultaneous partial beam paths (in accordance with the foregoing definition) are already there when there is only one mirror segment arrangement present, the superpositioning of which partial beam paths should now be so precise that the images which are respectively produced by the partial beam paths in the image plane and which are in mutually superposed relationship are identical in terms of the resolution achieved by the projection objective and coincide as exactly as possible. Accordingly there are two challenges for the measuring arrangement: on the one hand it is to ensure that the optical distortion effects in respect of all simultaneous beam paths are identical within certain tolerance limits, and on the other hand the respective images should be superposed as exactly as possible within the resolution limits.

A basic possible embodiment of a measuring arrangement for the simultaneous partial beam paths and their superpositioning is described hereinafter with reference to FIGS. 3a-c and FIG. 4.

An optical projection system 300 and 400 respectively which is only indicated in FIGS. 3a-c and FIG. 4, similarly to the above-described embodiments, includes at least one mirror segment arrangement 310 and 410 respectively, wherein for the sake of simplicity only one further (unsegmented) mirror 320 and 420 respectively is shown.

Figure 4:
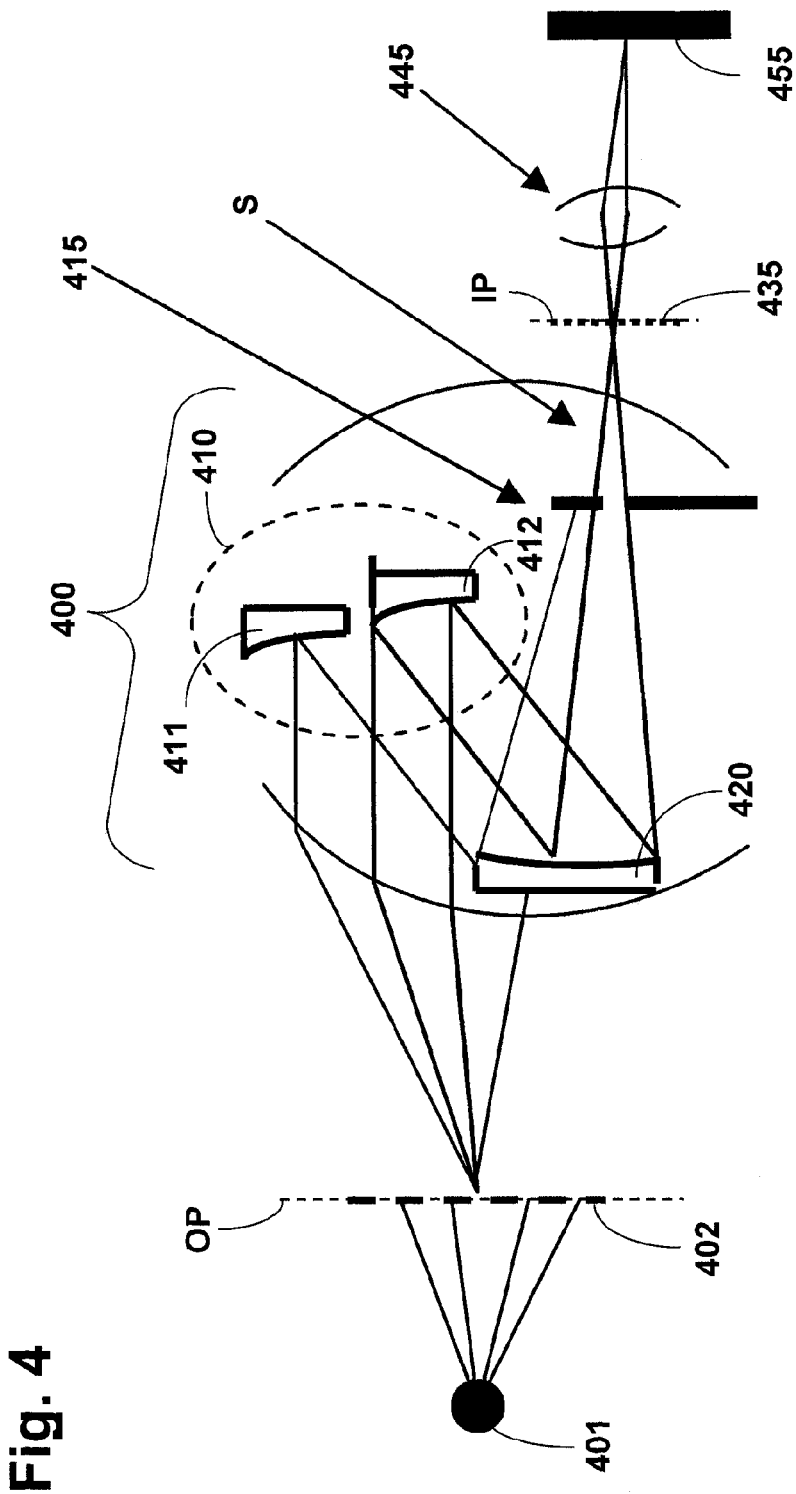
FIG. 4 shows a diagrammatic view of a possible structure according to the invention to illustrate the structure of a measuring arrangement for simultaneous partial beam paths.

The measuring arrangement of FIG. 4 has at least one detector 455 arranged downstream of the projection objective 400 (only diagrammatically indicated), in the light propagation direction. In addition the measuring arrangement has a measuring light source 401 upstream of the projection objective 400 in the light propagation direction, the measuring light source 401 producing radiation with defined properties in the object plane.

The measuring arrangement for the simultaneous partial beam paths and the superpositioning thereof is to perform in particular the following tasks:

a) measuring the aberrations of the wave front produced by a partial beam path when imaging a point light source (sometimes also referred to as the "system wave front"). The point light source can be arranged at various locations in the object plane OP, preferably in the region of the so-called scanner slot. Suitable arrangements and methods for measuring those aberrations are known for example from US 2008/0144043 A1 or U.S. Pat. No. 7,333,216 B2.

b) measuring the distortion of the image produced by a partial beam path, in particular in the region of the scanner slot. Suitable arrangements and methods for distortion measurement are also known in the state of the art, for example from U.S. Pat. No. 7,019,824 B2.

c) measuring the superpositioning of the images produced by at least two partial beam paths in the image plane IP or wafer plane, in particular in the region of the scanner slot S.

In addition the measuring arrangement has a selectively acting shutter arrangement 415 for selecting given solid angle regions of the light, which makes it possible to limit the illumination of at least one mirror segment arrangement selectively to different ones of the mirror segments.

Figure 3:
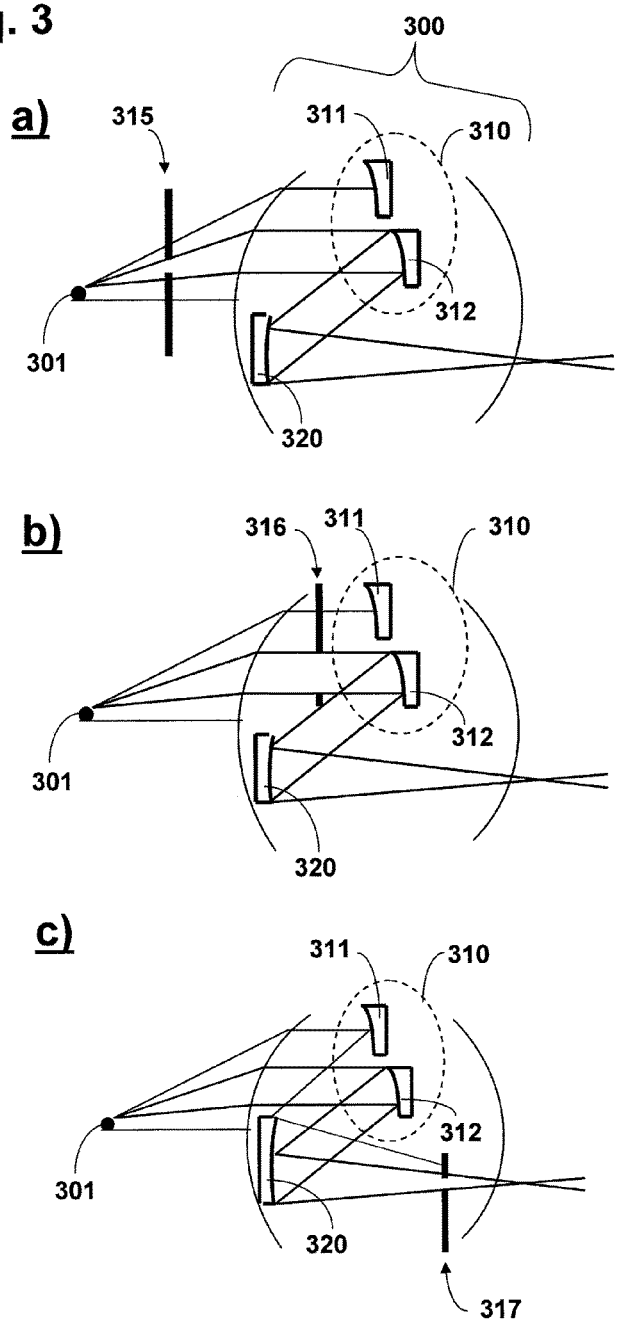
FIG. 3a-c shows different views to illustrate different possible shutter arrangements in a measuring arrangement according to the invention.

In relation to the light propagation direction as diagrammatically shown in FIGS. 3a-c, such a shutter arrangement can be arranged either directly downstream of the mask R (see reference 315 in FIG. 3a) disposed in the object plane OP, between two mirrors or mirror segment arrangements 310 and 320 (see reference 316 in FIG. 3b) or in the light propagation direction directly upstream of the detector arrangement (see reference 317 in FIG. 3c).

In that respect, for selection of the partial beam paths via the shutter arrangement, it is advantageous to dispose all individual openings in a common shutter plane and to select a respective one thereof by a displaceable shutter. The openings in the shutter arrangement are determined in terms of position and size by the partial beam path produced by the measuring light source 301 and 401 respectively, along the respective pairs of mirrors. Thus for each partial beam path there exists an associated shutter opening of respective position, shape and size.

The measurement arrangement according to the invention makes it possible in particular to be able to check the respective contribution of the individual partial beam paths to the (overall) image produced in the image plane, separately or in targetedly selectable combinations.

To perform the above-described tasks in accordance with a) and b), the methods already referred to are known from the state of the art. By combination with the above-described shutter arrangement for selection of the partial beam paths, it is thus possible to measure aberration and distortion for each partial beam path.

Performance of the task in accordance with c), that is to say for measuring the superpositioning of the images produced by at least two partial beam paths in the wafer plane, involves the selectively acting shutter arrangement according to the invention being combined with further measuring arrangements for superpositioning of the images.

The measuring arrangement for superpositioning of the images produced by the partial beam paths must evaluate at least one surface element in positionally resolved fashion in the image plane in order to be able to provide information about the superpositioning. For that purpose the apparatus based on the moiré principle for distortion measurement in accordance with above-mentioned U.S. Pat. No. 7,019,824 B2 can be suitably enlarged, as diagrammatically shown in FIG. 4:

Referring to FIG. 4 a first pattern 402 arranged in the object plane OP is imaged onto a second pattern 435 arranged in the image plane IP and by superpositioning forms a moiré pattern which in turn can be imaged by a subsequent optical imaging system 445 and recorded by a positional resolving camera 455. Similarly to the above-described embodiments the optical projection system 400 only indicated in FIG. 4 includes at least one mirror segment arrangement 410, only one further (unsegmented) mirror 420 being shown for the sake of simplicity. The first pattern 402 and the second pattern 435 can be embodied in particular in "parquet-like" fashion in order to obtain information in different spatial directions, with the minimum possible number of measurement steps. Evaluation of the moiré pattern formed by superpositioning makes it possible to recognize differences between the optically produced image and the second pattern, in particular distortions which correspond to changes in image position. For building up the image in a stepwise procedure optical imaging can be effected systematically by way of one or more partial beam paths, in which respect different partial beam path effects can be compared together and their cooperation can be checked.

A possible method of orienting and adjusting the partial beam paths with respect to each other using that measuring arrangement can take place as follows:

Firstly a first partial beam path is selected via the shutter arrangement 415 and the superpositioning of the image of the first mask 402 arranged in the object plane OP with the second mask 403 arranged in the image plane is observed for that first partial beam path, with the masks 402, 403 being oriented relative to each other. The distortion in the first partial beam path can be inferred from the first moiré pattern which is produced in that case. Then, with the mask positions being unaltered, a second partial beam path is selected via the shutter arrangement 415 and produces a second moiré pattern, wherein deviations in that second partial beam path from the first partial beam path lead to differences between the second moiré pattern and the first moiré pattern. Deviations in the optical properties of the second partial beam path from the first partial beam path can be inferred from the deviations between the two moiré patterns. In addition, with that knowledge, the second partial beam path can be optimized in relation to the first partial beam path in respect of image position and distortion by way of a suitable manipulator system. That step is repeated for all partial beam paths so that as a result all partial beam paths are oriented relative to each other.

In accordance with a further embodiment the position of the shutter arrangement 415 can also be altered in such a way that more than one partial beam path simultaneously contributes to imaging. In that case the individual partial images are superposed incoherently in the image plane to form a multiple partial image which can also be evaluated as described. That combination can be implemented at the same time until opening of all partial beam paths occurs so that as a result the overall projection objective is adjusted with all mirror segment arrangements.

Figure 5:
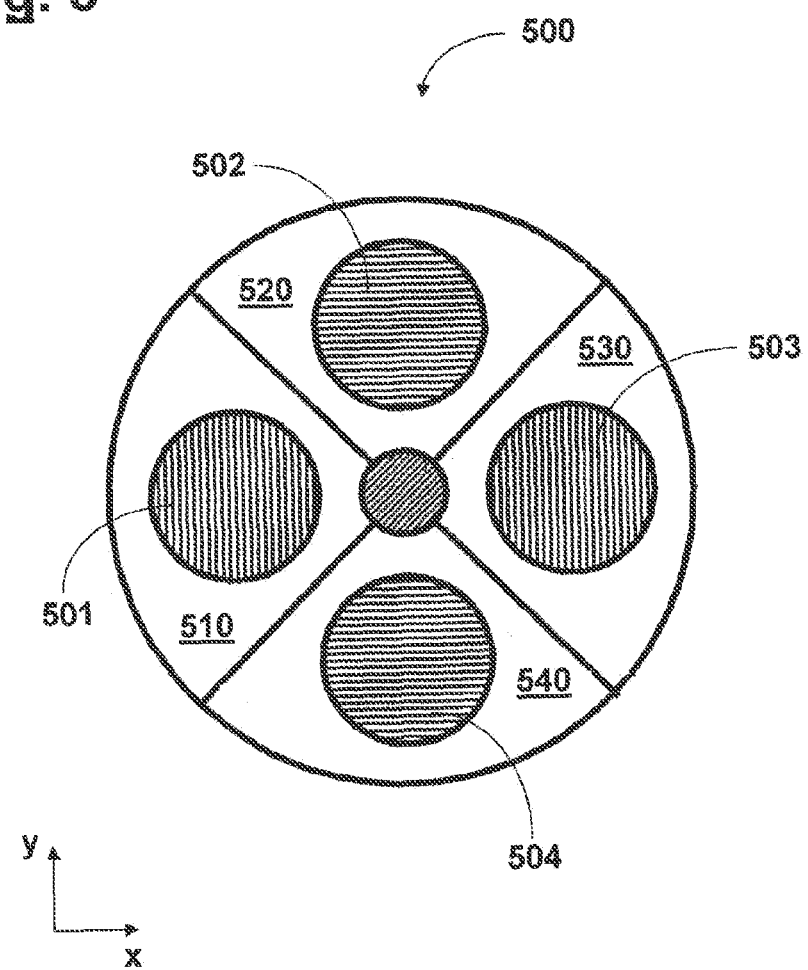
FIG. 5 shows a diagrammatic view to illustrate a further embodiment of the invention.

FIG. 5 shows a diagrammatic view to illustrate a further embodiment of the invention. For that purpose FIG. 5 shows a segmentation by way of example of a (comparatively large) rotationally symmetrical mirror which is near the pupil and which has a mirror opening or mirror bore for a beam to pass therethrough. The exit pupil is centrally obscured. A mirror segment arrangement 500 is afforded by the segmentation of that mirror in an initially similar fashion to the above-described embodiments.

In this case segmentation in the mirror segment arrangement 500 is effected in dependence on the respectively set illumination setting. In other words, before selecting a suitable segmentation, the illumination setting used is firstly established. The transitional regions or "cuts" between the individual mirror segments are so selected in that case that no diffraction order is incident on those transitional regions.

In the specific example in FIG. 5 the illumination setting has four illumination poles 501-504 which are respectively turned through 45° relative to the y-axis, the respective diffraction orders being illustrated for horizontally and vertically oriented dense lines respectively.

In conjunction with that illumination setting, as shown in FIG. 5 segmentation or division of the mirror segment arrangement 500 into four mirror segments 510-540 is adopted, which are respectively arranged in the corresponding four segments turned through 45° with respect to the y-axis in the illustrated coordinate system.

The arrangement in FIG. 5 makes it possible on the one hand to compensate for field-constant low-order pupil errors, for example astigmatism and coma. A further advantage with this arrangement that it is only ever necessary to adjust relative to each other those ones of the mirror segments 510-540, which contribute to the diffraction image of the same structure. In the specific embodiment of horizontal and vertical dense lines, only two respective pairs of mirror segments are to be adjusted relative to each other, more specifically on the one hand the mirror segments 520 and 540 relative to each other and on the other hand the mirror segments 510 and 530 relative to each other. In contrast the relative arrangement for example of the mirror segment 520 relative to the mirror segment 530 or the mirror segment 510 is immaterial. That considerably reduces the demands on adjustment as, in comparison with an adaptive mirror which is used over the full surface area, only half the number of parameters have to be jointly controlled.

In addition there is an advantage in principle regarding the design of the projection exposure apparatus in that the functionalities of providing an "optical surface" and affording mechanical stability can be distributed to different components ("mirror segment" and "carrier structure").

Figure 6:
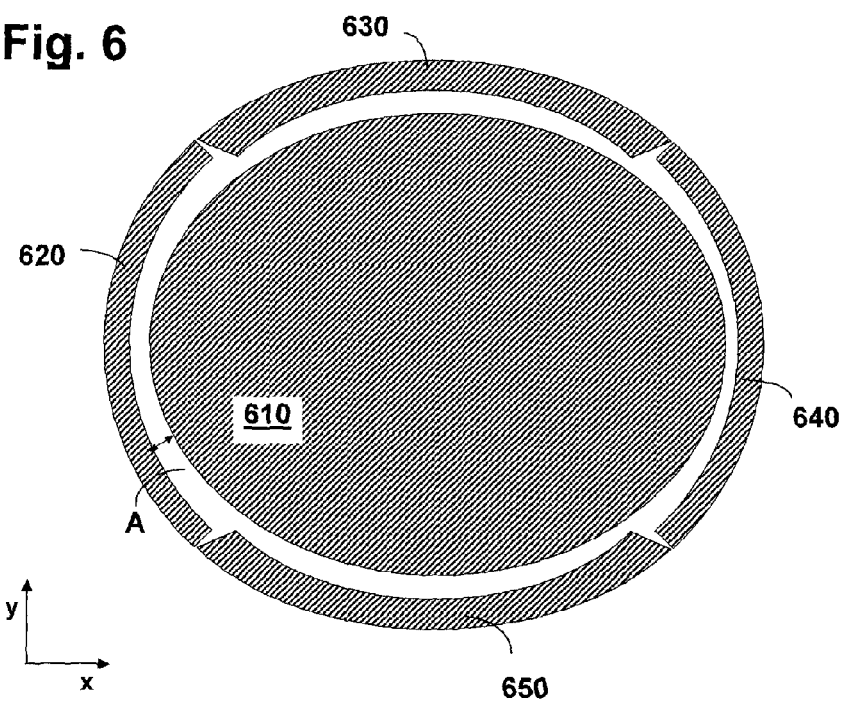

FIG. 6 shows an embodiment of a mirror segment arrangement 600 which is designed in such a way (or with such a "partition" between the individual mirror segments) that mirror segment intermediate spaces between the mirror segments are of a geometry which is at least region-wise in a ring shape or in the shape of a ring segment.

The mirror segment arrangement 600 diagrammatically illustrated in FIG. 6 includes a central mirror segment 610 as the "main mirror", the size of which can be suitably selected in terms of aspects relating to production engineering, and the main mirror 610 can therefore also be produced with comparatively no problems. In addition the mirror segment arrangement 600 in the illustrated embodiment (and without the invention being restricted thereto) includes four mirror segments 620, 630, 640 and 650 as "secondary mirrors" which are in the form of circular ring segments with substantially radially extending segment intermediate spaces so that they are arranged around the central mirror segment 610 forming the main mirror, at a certain radial spacing relative to the central mirror segment 610. That radial spacing can be used for example for holder elements, a sensor mechanism and/or an actuator mechanism.

In addition the mirror segments 620, 630, 640 and 650 are at the minimum possible spacing relative to each other (that is to say in the azimuthal direction with respect to the optical system axis extending in the z-direction in the illustrated coordinate system) so that no structural space worth mentioning is required in the azimuthal direction. Consequently the above-discussed effect linked to the presence of azimuthal mirror segment intermediate spaces, namely that identical structures in a different orientation have different imaging characteristics, is at least substantially avoided.

Figure 7A:
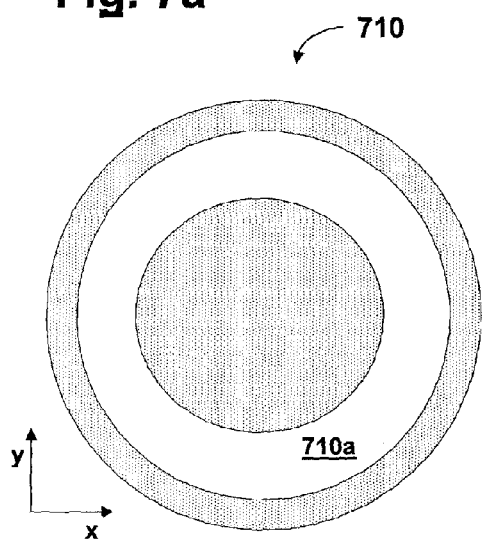
Figure 7B:
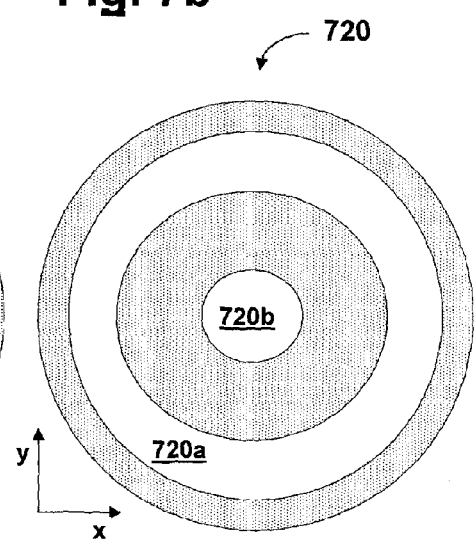

FIGS. 7a and b show diagrammatic views illustrating examples of a respective obscuration shutter arrangement 710 and 720, as is arranged according to the invention preferably in a pupil plane or in the proximity thereof (as defined hereinafter with reference to FIG. 9). In that respect the obscuration shutter arrangement 710 of FIG. 7a is defined for an optical system without central pupil obscuration and the obscuration shutter arrangement 720 of FIG. 7b is designed for an optical system with central pupil obscuration.

The regions which are respectively shadowed by the obscuration shutter arrangement 710 and 720 are respectively identified by 710a, 720a and 720b. The obscuration shutter arrangement 710 and 720, as described hereinafter, is so designed in each case that the shadow it casts on the mirror segment arrangement 600 covers over the radially extending mirror segment intermediate spaces. The aim and purpose of the respective obscuration shutter arrangement 710 and 720 is thus to previously cut out light which, without the obscuration shutter arrangement 710 and 720, would be incident in the annular gap A between the main mirror 610 and the secondary mirrors 620-650, so that field-dependent effects or field-dependent changes in the imaging characteristics are avoided.

Figure 8:
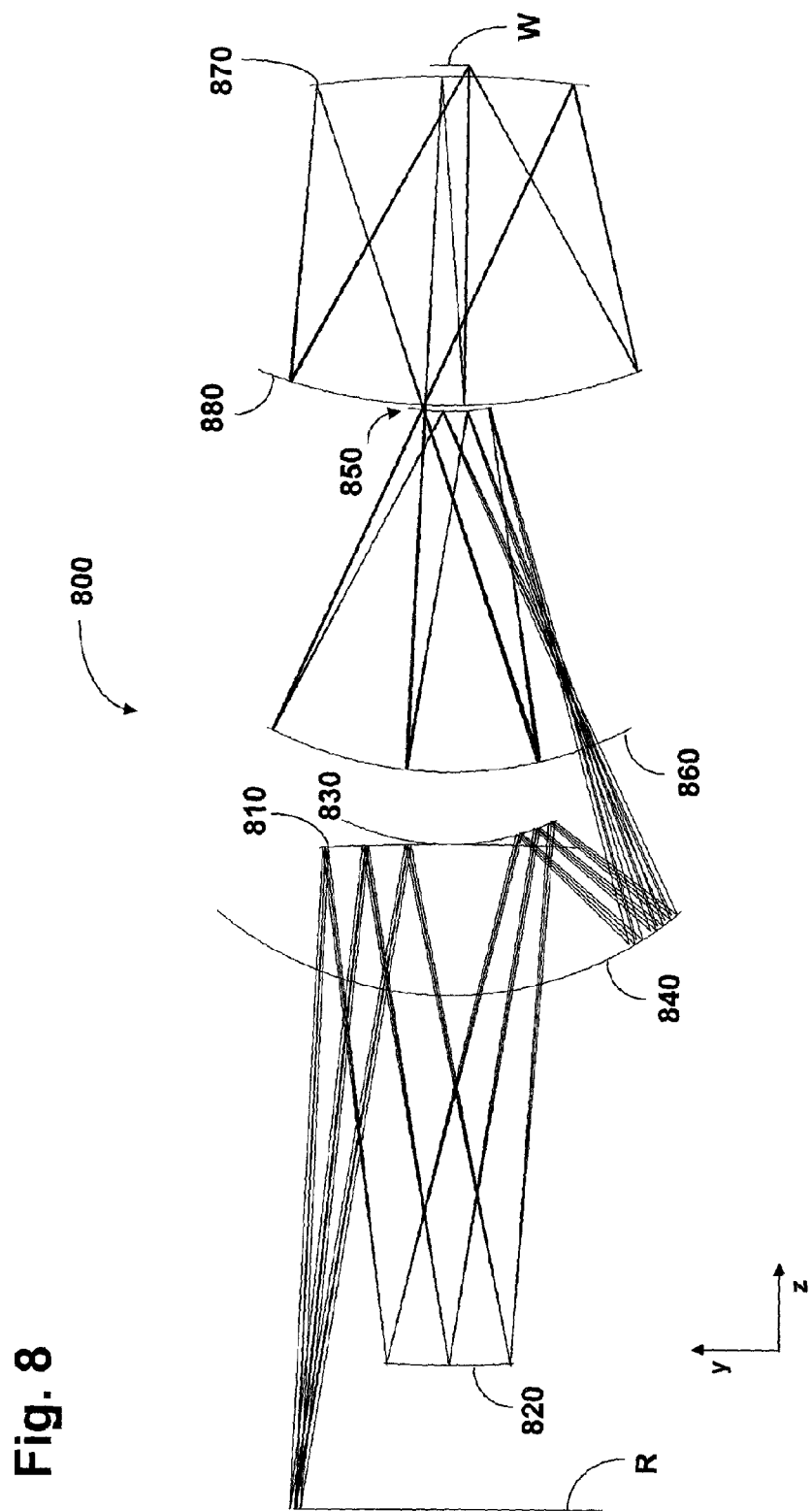

FIG. 8 shows an embodiment of a projection objective 800 designed for EUV radiation, with a numerical aperture of NA=0.6, which for imaging the structures of a reticle R onto the wafer W has a total of eight mirrors 810-880, wherein the mirror 880 which is last at the image plane side with respect to the beam path can be in the form of a mirror segment arrangement comprising separate mirror segments. The second mirror 820 in the beam path forms a mirror near the pupil. Reference is directed to FIG. 9 for the definition of the criterion of "pupil nearness" and also field nearness.

Figure 9:
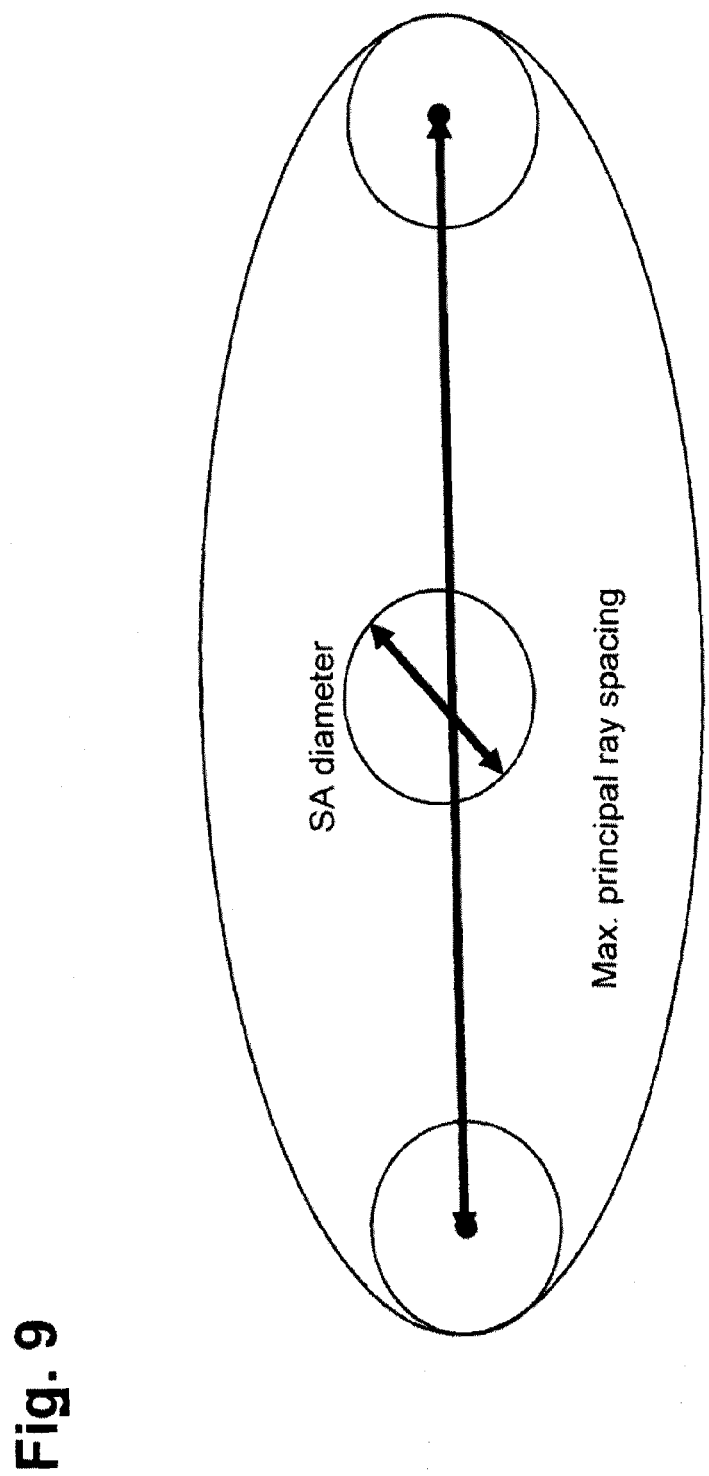

Referring to FIG. 9 the pupil or field nearness respectively can be quantitatively described by way of a parameter P(M) (as described for example in US 2008/0165415 A1), wherein the parameter P(M) is defined as:

$$P(M) = \frac{D(SA)}{D(SA) + D(CR)}, \quad (1)$$

wherein D(SA) denotes the subaperture diameter and D(CR) denotes the maximum principal ray spacing (from all field points or defined over all field points of the optically used field) on the optical surface M in the plane in question. Thus P(M)=0 applies for a field mirror (with a subaperture diameter of zero) and P(M)=1 for a pupil mirror (with a principal ray spacing of zero). The above-mentioned mirror 820, like the obscuration shutter arrangement, is preferably disposed in a plane of the projection objective, in which the parameter P(M) is at least 0.8, in particular at least 0.9.

Figure 10B:
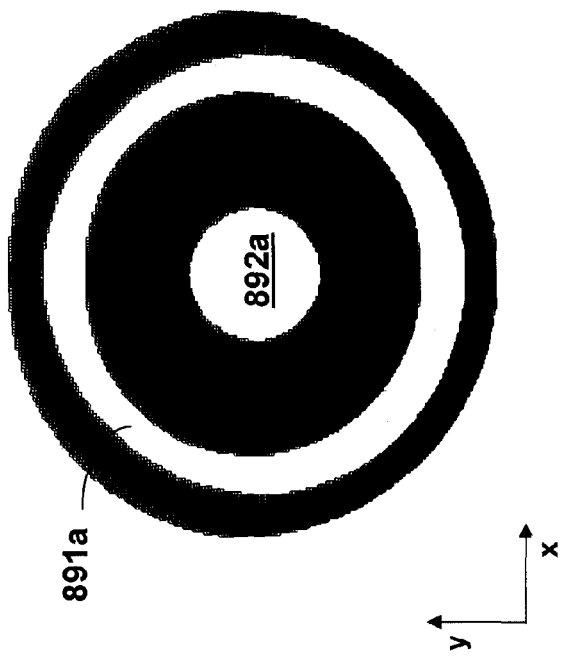
Figure 10A:
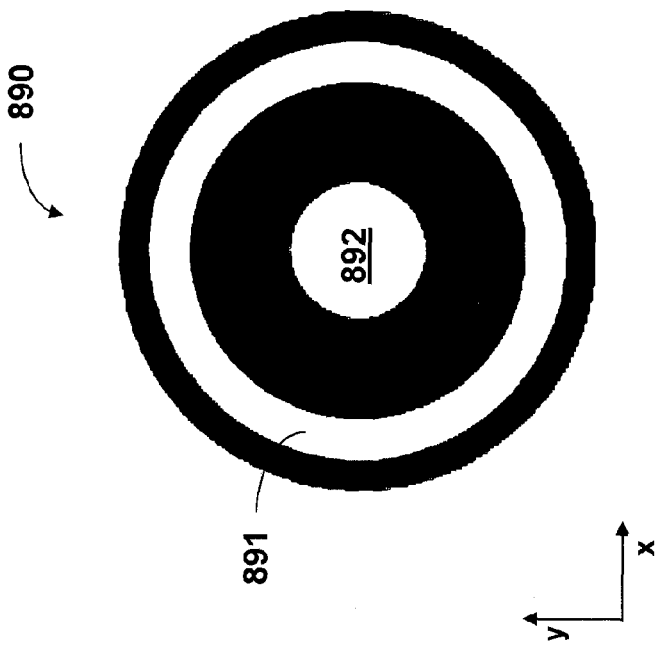

An obscuration shutter arrangement 890 (not shown in FIG. 8) is also disposed in the pupil nearness in accordance with the foregoing definition. The obscuration shutter arrangement 890 as shown in FIG. 10a has a ring-shaped obscuration shutter 891 and a central obscuration shutter 892. FIG. 10b shows the respective shadowed regions which result out of the action of the obscuration shutter arrangement 890 at the location of the last mirror 880 at the image plane side, wherein reference 891a denotes the shadow of the ring-shaped obscuration shutter 891 and reference 892*a* denotes the shadow of the central obscuration shutter 892.

FIG. 11 diagrammatically shows further possible embodiments of obscuration shutter arrangements 910, 920, 930 and 940. What is common to those obscuration shutter arrangements 910-940 is that they each involve a four-fold symmetry.

Figure 11A:
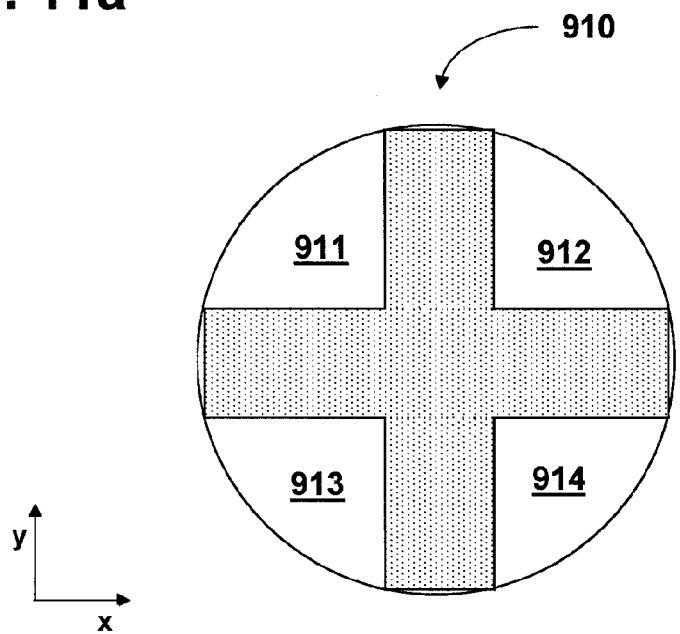

Referring to FIGS. 11*a* and *b* obscuration shutters 911-914 and 921-924 respectively which are suitable for forming the obscuration shutter arrangements 910 and 920 are arranged in the peripheral direction or azimuthally (with respect to the optical system axis extending in the z-direction in the illustrated coordinate system), and more specifically (with respect to the respective central axis or axis of symmetry), at an angle of 45°, 135°, 225° and 315° respectively with respect to the y-axis. In that case the geometry of the obscuration shutters 911-914 is so selected that this affords a cross-shape geometry of the non-shadowed region whereas the geometry of the obscuration shutters 921-924 is so selected that this affords a star-shaped geometry of the non-shadowed region.

It is to be noted that the concept according to the invention whereby the mirror segment intermediate spaces lie in the shadow of the obscuration shutter can also be embodied by the embodiment shown in FIG. 11. It is to be noted however that in this case the above-described advantageous configuration with mirror segment intermediate spaces which are in the shape of a ring or ring segments is not afforded so that only a limited selection of illumination settings is permitted with these embodiments.

Figure 11B:
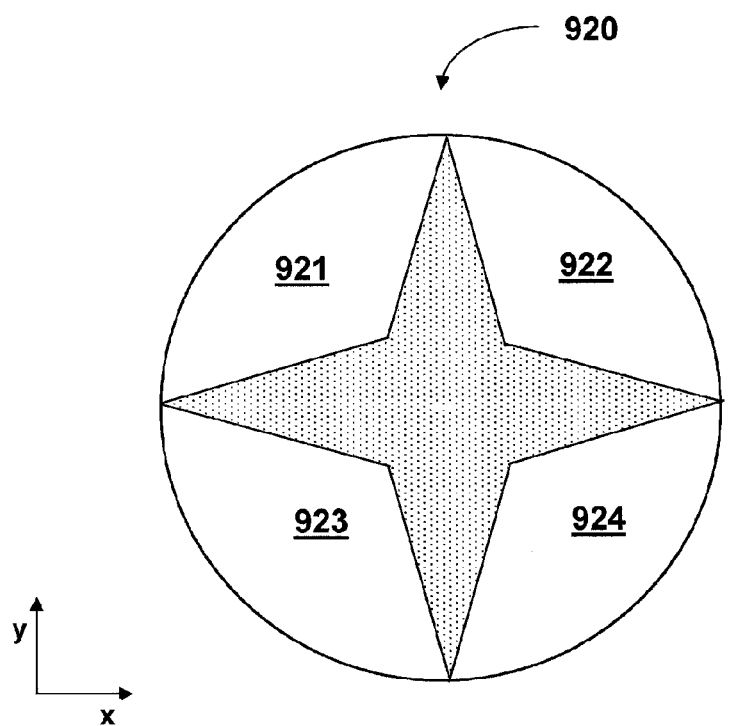
Figure 11C:
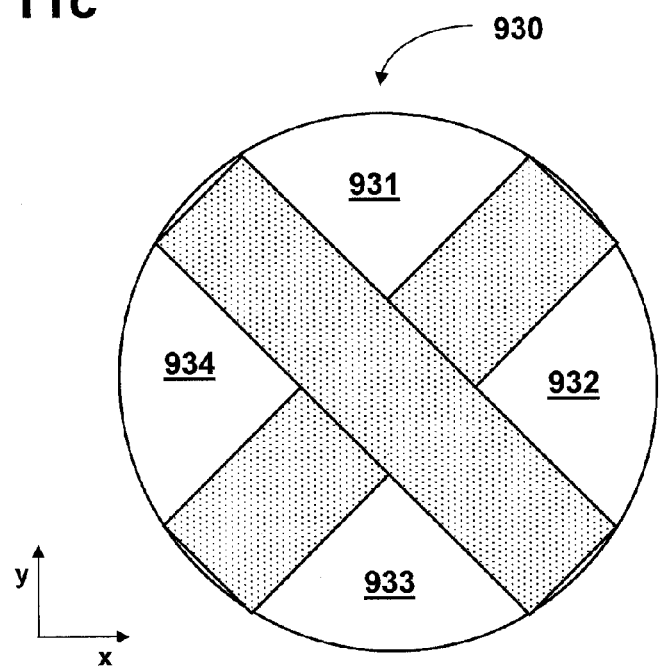
Figure 11D:
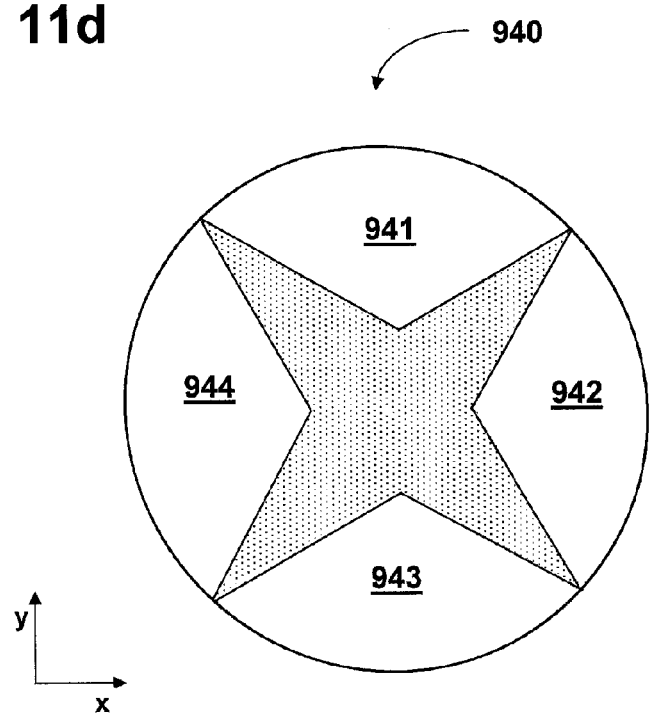

Referring to FIGS. 11*c* and *d*, obscuration shutters 931-934 and 941-944 respectively which are suitable for giving the obscuration shutter arrangements 930 and 940 are arranged in the peripheral direction or azimuthally (with respect to the optical axis extending in the z-direction in the illustrated coordinate system), and more specifically (with respect to the respective central axis or axis of symmetry), at an angle of 0°, 90°, 180° and 270° respectively with respect to the y-axis. In this case the geometry of the obscuration shutters 931-934 in FIG. 11*c* is so selected, similarly to FIG. 11*a*, that this gives a cross-shaped geometry of the non-shadowed region whereas the geometry of the obscuration shutters 941-944 in FIG. 11*d*, similarly to FIG. 11*b*, is so selected that this involves a star-shaped geometry of the non-shadowed region.

Even if the invention has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present invention and the scope of the invention is limited only in the sense of the accompanying claims and equivalents thereof.

The invention claimed is:

1. A projection objective configured to image an object plane into an image plane, the projection objective comprising:
 a first mirror comprising a main mirror and a segment arrangement comprising a plurality of separate circular ring segment mirrors separated from each other by transitional regions between adjacent circular ring segment mirrors,
 wherein during use of the projection objective:
  partial beam paths which are different from each other are associated with the circular ring segment mirrors;
  the partial beams image the object plane into the image plane;
  the partial beam paths are superposed in the image plane; and
  at least two partial beams are reflected from different circular ring segment mirrors and are superposed on the same point in the image plane; and
 wherein the circular ring segment mirrors surround the main mirror, and the projection objective is an EUV microlithographic projection objective.

2. The projection objective of claim 1, wherein, along a path of a partial beam from the object plane to the image plane, the first mirror is a last reflecting arrangement of the projection objective.

3. The projection objective of claim 1, wherein the first mirror is a mirror of the projection objective having a maximum of total optically effective surface size.

4. The projection objective of claim 1, wherein the segment arrangement comprises at least three circular ring segment mirrors.

5. The projection objective of claim 1, wherein the circular ring segment mirrors respectively form with each other a continuous reflecting surface interrupted only by the transitional regions.

6. The projection objective of claim 1, wherein the circular ring segment mirrors respectively form with each other a reflecting surface interrupted only by the transitional regions between adjacent circular ring segment mirrors.

7. The projection objective of claim 1, further comprising a shutter arrangement configured so that during use of the projection objective illumination of the first mirror is selectively limited to different circular ring segment mirrors.

8. The projection objective of claim 1, wherein at least two of the circular ring segment mirrors are movable relative to each other.

9. The projection objective of claim 1, further comprising a shutter arrangement configured so that a space between circular ring segment mirrors is at least partially arranged in a shadow of the obscuration shutter arrangement.

10. A projection objective configured to image an object plane into an image plane, the projection objective comprising:
 a plurality of mirrors including a mirror having a maximum total reflecting surface compared to the other mirrors, the mirror having the maximum total reflecting surface comprising a main mirror and a segment arrangement comprising a plurality of separate circular ring segment mirrors separated from each by transitional regions between adjacent circular ring segment mirrors,
 wherein the circular ring segment mirrors surround the main mirror, and the projection objective is an EUV microlithographic projection objective.

11. A projection objective configured to image an object plane into an image plane, the projection objective comprising:
 a mirror comprising a segment arrangement comprising a plurality of separate circular ring segment mirrors separated from each by transitional regions between adjacent circular ring segment mirrors; and
 a shutter arrangement configured so that, during use of the projection objective, a space between circular ring segment mirrors is at least partially arranged in a shadow of the shutter arrangement.

12. The projection objective of claim 11, wherein the space is rotationally symmetric.

13. The projection objective of claim 11, wherein the shutter arrangement is rotationally symmetric.

14. The projection objective of claim 11, wherein the shutter arrangement is a plane of the projection objective in which a parameter P(M) which is defined as:

$$P(M) = \frac{D(SA)}{D(SA) + D(CR)},$$

and wherein P(M) is at least 0.8, D(SA) is a subaperture diameter, and D(CR) is a maximum principal ray spacing defined over all field points of the optically used field on an optical surface M in the plane.

15. The projection objective of claim 11, wherein the projection objective has an optical axis, the shutter arrangement is of n-fold symmetry with respect to the optical axis, and n is a natural number greater than zero.

16. A method of producing a projection objective of an EUV microlithographic projection exposure apparatus configured to image an object plane into an image plane, the projection objective comprising a plurality of mirrors, at least one of the plurality of mirrors comprising a main mirror and a plurality of separate circular ring segment mirrors separated from each by transitional regions between adjacent circular ring segment mirrors, the plurality of separate circular ring segment mirrors comprising a first circular ring segment mirror and a second ring segment mirror which is different from the first ring segment mirror, the plurality of circular ring segment mirrors surrounding the main mirror, the method comprising:

reflecting a first partial beam from the first circular ring segment mirror;

reflecting a second partial beam from the second circular ring segment mirror; and superposing the first and second partial beams in the image plane.

17. A method of optically adjusting a projection objective of a microlithographic projection exposure apparatus, the projection objective comprising a plurality of mirrors, the projection objective comprising a main mirror and a segment arrangement comprising a plurality of separate circular ring segment mirrors separated from each by transitional regions between adjacent circular ring segment mirrors, the method comprising:

orienting the circular ring segment mirrors in an orientation in which a first subset of circular ring segment mirrors image an object plane of the projection objective into an image plane of the projection objective; and orienting the circular ring segment mirrors in an orientation in which a second subset of circular ring segment mirrors image an object plane of the projection objective into an image plane of the projection objective, wherein the first subset of circular ring segment mirrors is not identical to the second subject of circular ring segment mirrors.

18. An arrangement configured to optically adjust a microlithographic projection objective comprising a plurality of mirrors, the projection objective comprising a mirror segment arrangement comprising a plurality of separate circular ring segment mirrors separated from each by transitional regions between adjacent the circular ring segment mirrors, the arrangement comprising:

a variable shutter arrangement configured to selectively illuminate one or more of the circular ring segment mirrors during use of the arrangement.

19. A projection objective configured to image an object plane into an image plane, the projection objective comprising:

a first mirror segment arrangement comprising a first plurality of separate mirror segments separated from each by transitional regions between adjacent mirror segments, wherein during use of the projection objective:

at least one of the mirror segments has a shape that is different from that of other mirror segments;

partial beam paths which are different from each other are associated with the first mirror segments;

the partial beams image the object plane into the image plane;

the partial beam paths are superposed in the image plane; and at least two partial beams are reflected from different mirror segments and are superposed on the same point in the image plane; and wherein the projection objective is an EUV microlithographic projection objective.

* * * * *

UNITED STATES PATENT AND TRADEMARK OFFICE
CERTIFICATE OF CORRECTION

| | | |
|---|---|---|
| PATENT NO. | : 9,720,329 B2 | Page 1 of 1 |
| APPLICATION NO. | : 15/070757 | |
| DATED | : August 1, 2017 | |
| INVENTOR(S) | : Hartmut Enkisch et al. | |

It is certified that error appears in the above-identified patent and that said Letters Patent is hereby corrected as shown below:

In the Specification

Column 6, Line 38, delete "FIG. 3a-c" and insert -- FIGS. 3a-c --.

Column 9, Line 64, delete "FIG. 4:" and insert -- FIG. 4. --.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*